United States Patent
Bull

(10) Patent No.: US 7,653,795 B2
(45) Date of Patent: Jan. 26, 2010

(54) CONTROL OF METASTABILITY IN THE PIPELINED DATA PROCESSING APPARATUS

(75) Inventor: David Michael Bull, Cambridgeshire (GB)

(73) Assignee: ARM Limited, Cambridge (GB)

( * ) Notice: Subject to any disclaimer, the term of this patent is extended or adjusted under 35 U.S.C. 154(b) by 104 days.

(21) Appl. No.: 12/068,598

(22) Filed: Feb. 8, 2008

(65) Prior Publication Data

US 2008/0209152 A1 Aug. 28, 2008

Related U.S. Application Data

(63) Continuation of application No. 11/121,309, filed on May 4, 2005, now abandoned.

(51) Int. Cl.
*G06F 9/312* (2006.01)
*G06F 11/16* (2006.01)

(52) U.S. Cl. .................. 711/169; 712/213; 369/53.44

(58) Field of Classification Search ................ 711/169; 712/27, 213, 219, 225; 369/47.17, 53.18, 369/53.44
See application file for complete search history.

(56) References Cited

U.S. PATENT DOCUMENTS 5,377,336 A 12/1994 Eickemeyer et al.

(Continued)

OTHER PUBLICATIONS

Michael Golden and Trevor N. Mudge, "Hardware Support for Hiding Cache Latency," Ann Arbor, MI, Feb. 1, 1993. Available from http://hdl.handle.net/2027.42/5151, accessed Sep. 8, 2009.*

(Continued)

*Primary Examiner*—Matt Kim
*Assistant Examiner*—Hal Schnee
(74) *Attorney, Agent, or Firm*—Nixon & Vanderhye P.C.

(57) ABSTRACT

A method and integrated circuit for accessing data in a pipelined data processing apparatus in which the operating conditions of the pipelined data processing apparatus are such that metastable signals may occur on at least the boundaries of the pipelined stages is disclosed. The method comprises the steps of: receiving an indication that an instruction is to be processed by the pipelined data processing apparatus; generating a memory access prediction signal, the memory access prediction signal having a value indicative of whether or not the instruction is likely to cause a read access from a memory; generating a predicted memory access control value from the memory access prediction signal, the predicted memory access control value being generated to achieve and maintain a valid logic level for at least a sampling period thereby preventing any metastability in the predicted memory access control value; and in the event that the predicted memory access control value indicates that a read access is likely to occur, causing a read access to be initiated from the memory. Through this approach, an indication that an instruction is to be processed by the pipelined data processing apparatus is received and a memory access prediction signal indicative of whether or not the instruction is likely to cause a read access from a memory is then generated. The predicted memory access control signal is generated in a way which prevents any metastability being present in that signal. Hence, the signals used in a read access are prevented from being metastable which removes the possibility that metastable signals are used directly in the arbitration of data accesses. Also, the metastable signals may be prevented from being propagated from stage to stage.

17 Claims, 3 Drawing Sheets

U.S. PATENT DOCUMENTS

| | | |
|---|---|---|
| 6,415,380 B1 | 7/2002 | Sato |
| 6,681,317 B1 | 1/2004 | Mathews |
| 6,781,429 B1 | 8/2004 | Smith |
| 6,986,027 B2 | 1/2006 | Barowski et al. |
| 7,035,997 B1 * | 4/2006 | Musoll et al. ............... 712/205 |
| 2002/0091915 A1 | 7/2002 | Parady |
| 2004/0003218 A1 | 1/2004 | Ukai |
| 2004/0064663 A1 | 4/2004 | Grisenthwaite |

OTHER PUBLICATIONS

Hennessy et al., Computer Architecture: A Quantitative Approach, San Mateo, CA; Morgan Kaufmann Publishers, Inc., 1990, pp. 252-257, 264-265, 290-296, 308-311, and 436.

* cited by examiner

CONTROL OF METASTABILITY IN THE PIPELINED DATA PROCESSING APPARATUS

This application is a continuation of U.S. application Ser. No. 11/121,309, filed on May 4, 2005, now abandoned the entire content of which is hereby incorporated by reference in this application.

FIELD OF THE INVENTION

The present invention relates to data access. Embodiments of the present invention relate to data access in a data processing apparatus in which signals used to cause a data access to occur may be metastable.

BACKGROUND OF THE INVENTION

In a data processing apparatus, such as a pipelined data processing apparatus, a series of serially-connecting processing stages are formed. Between each stage of the pipeline a signal-capture element such as a latch or a sense amplifier may be provided into which one or more signal values are stored.

The logic of each processing stage is responsive to input signals received from preceding processing stages or from elsewhere and generates output signals to be stored in an associated output latch. In a typical pipelined data processing apparatus, the time taken for the processing logic to complete any processing operations determines the speed at which the data processing apparatus may operate. If the processing logic of the processing stages is able to complete its processing operations in a short period of time, then the signals may rapidly advance through the output latches, resulting in high speed processing. However, the system can not advance signals between stages more rapidly than the speed at which the slowest processing logic in a stage is able to perform its processing operations on received input signals and generate the appropriate output signals. This limits the performance of the system.

Some known techniques seek to overcome some of these processing speed limitations. For example, it is possible to advance the driving of the processing stages until the slowest processing stage is unable to keep pace. Also, sometimes it is possible to reduce the power consumption of the data processing apparatus and the operating voltage will be reduced up to the point at which the slowest processing stage is no longer able to keep pace. It will be appreciated that in both of these situations processing errors may occur.

These processing errors occur typically because the output signal to be stored in the associated output latch does not achieve a predetermined stable voltage level for a period of time prior to a clock signal being provided to the latch (known as the set-up period) or that the output signal is not held for a predetermined period after the clock signal is provided to the output latch (known as the hold period).

The change of state of the signal during these errors is transient (i.e. it is pulse like) and a reset or a rewrite of the latch or device causes normal behaviour to resume thereafter. The signal in this transient state is said to be metastable because it fails to achieve a valid logic level for a period of time, but instead hovers at a metastable voltage somewhere between the logic levels, before transitioning to a valid logic level.

In a data processing apparatus which has a memory, it is desirable to perform accesses to that memory as quickly as possible since this has a beneficial effect on processor throughput.

The structure of a memory, such as a single-ported cache, is such that both read accesses and write accesses occur using a common address interface. Data should only be written to the cache (known as committing) when the write access has been confirmed to not contain any errors.

In the case of a write access, if it transpires that the write access is in some way incorrect or invalid then the data stored in the memory may be corrupt. Furthermore, should the signals used in a write access be metastable then the data stored in the memory may be corrupt. These problems can be overcome by adding extra stages to the processing logic which can detect that such an error has occurred due to the presence of this metastability. The metastability determination can then be made prior to the data being committed to memory. The metastability determination is typically performed at system level and takes a number of processing cycles. Hence, the write access may be buffered in a write buffer and only committed some cycles later when it is known that no errors have occurred. It will be appreciated that such an arrangement has a minimal impact on throughput since write accesses with rarely be on the critical path.

However, it is desirable to execute read accesses as soon as possible. This is because read accesses will typically be on the critical path and any latency in executing read accesses will have a detrimental effect on throughput. Accordingly, the pipelined stages prior to the execution stages are typically optimised to process read accesses as quickly as possible. Accordingly, typical fetch and decode stages would normally be optimised to fetch a read access instruction in a single processing cycle and then decode that instruction in a subsequent single processing cycle. This ensures that the execution of the read access can occur at an early stage.

Also, arbitration techniques are provided in order to deal with the occurrence of concurrent read and write access over the common buses, with read accesses being given priority over write accesses. Accordingly, read accesses are performed in preference, with write accesses being placed in the write buffer and postponed until after the write access is confirmed to be error free and no read accesses are outstanding.

It is desired to provide improved techniques for performing data accesses.

SUMMARY OF THE INVENTION

According to one aspect of the present invention there is provided a method of accessing data in a pipelined data processing apparatus in which the operating conditions of the pipelined data processing apparatus are such that metastable signals may occur on at least the boundaries of the pipelined stages, the method comprising the steps of: receiving an indication that an instruction is to be processed by the pipelined data processing apparatus; generating a memory access prediction signal, the memory access prediction signal having a value indicative of whether or not the instruction is likely to cause a read access from a memory; generating a predicted memory access control value from the memory access prediction signal, the predicted memory access control value being generated to achieve and maintain a valid logic level for at least a sampling period thereby preventing any metastability in the predicted memory access control value; and in the event that the predicted memory access control value indicates that a read access is likely to occur, causing a read access to be initiated from the memory.

The present invention recognises that a problem exists whereby the signals used in a read access may be metastable and that this may cause metastable signals to be used directly in the arbitration of data accesses. This in turn can result in many different types of errors occurring when accessing data. In an extreme case, these errors may cause the data to become corrupted. It will be appreciated that corrupting data is undesirable at the best of times; however, data corruption due to metastability is particularly disadvantageous since it will be almost impossible to determine the corruption occurred since it is extremely unlikely that the status of the signals causing the corruption can be determined.

Also, the present invention recognises that the metastable signals may be propagated from stage to stage. For example, in arrangements where single cycle fetch and single cycle decode stages are provided, but more than one cycle is required to determine whether signals are metastable, preventing propagation of metastable signals into, for example an execute stage, cannot easily be controlled without postponing the execution of the data access itself.

As mentioned previously, write accesses are postponed by buffering until it is ensured that the write access is valid. Buffering the write access does not adversely affect throughput since the write access will rarely be on the critical path. However, the present invention also recognises whilst it may be possible to postpone read accesses, those read accesses are typically on the critical path and any delay in performing the read access will cause instructions in the pipeline to be stalled thereby significantly reducing the throughput of the data processing apparatus.

Accordingly, an indication that an instruction is to be processed by the pipelined data processing apparatus is received and a memory access prediction signal is then generated. The memory access prediction signal has a value indicative of whether or not the instruction is likely to cause a read access from a memory. Hence, an indication is provided when the instruction is likely to cause a read access. A predicted memory access control signal is generated from the memory access prediction signal.

The predicted memory access control signal is generated in a way which prevents any metastability being present in that signal. This is achieved by the predicted memory access control signal achieving and maintaining a valid logic level for at least a sampling period. A read access can then be initiated in the event that it is predicted that a read access is likely to occur.

In this way, a signal used to initiate a read access can be generated in a way which ensures that it will have no metastability. This is possible because that signal is merely a prediction signal rather than the decoded instruction itself and, hence, can be generated much earlier in the pipeline. Because the prediction signal is generated much earlier in the pipeline, it can be ensured that the signal used to cause the memory access has no metastability.

Hence, the signals used in a read access are prevented from being metastable which removes the possibility that metastable signals are used directly in the arbitration of data accesses. Also, the metastable signals may be prevented from being propagated from stage to stage.

In embodiments, the step of generating the memory access prediction signal comprises the steps of: determining a program counter value associated with the instruction to be processed; and referencing a lookup table to provide the value indicative of whether or not the instruction associated with that program counter value is likely to cause a read access from the memory; and propagating the value provided by the lookup table as the memory access prediction signal.

By referencing a lookup table, a rapid determination can be made of whether the instruction associated with program counter value is anticipated to cause a read access to occur.

In embodiments, the step of determining the program counter value occurs when processing the instruction during a fetch stage of the pipelined processor.

By making the determination early in the pipeline, sufficient time is provided to enable the predicted memory access control value to achieve a non-metastable condition by the time that that signal needs to be used to cause the read access to occur.

In embodiments, the method further comprises the step of: storing in the lookup table the value indicative of whether or not the instructions associated with program counter values are likely to cause read accesses from the memory.

In embodiments, the step of generating the predicted memory access control value comprises the steps of: passing the memory access prediction signal through a synchronising structure to generate the predicted memory access control value having a valid logic level.

In embodiments, the step of generating the predicted memory access control value comprises the steps of: passing the memory access prediction signal through a pair of latches, each latch being clocked to coincide with the passing of the instruction between subsequent boundaries of the pipelined stages.

By passing the memory access prediction signal through the pair of latches ensures that the resultant signal will have no metastability.

In embodiments, the step of generating the predicted memory access control value comprises the steps of: passing the memory access prediction signal to an input of a first latch; providing an intermediate signal on the output of the first latch as the instruction passes between first and second pipelined stages; passing the intermediate signal to an input of a second latch; and providing the predicted memory access control value on the output of the second latch as the instruction passes between second and third pipelined stages.

In embodiments, the first, second and third pipelined stages comprise fetch, decode and execute pipelined stages.

In embodiments, the step of passing the memory access prediction signal through a pair of latches causes the predicted memory access control value to have timing characteristics which achieve a valid logic level prior to a setup period prior to a sampling clock transitioning, said valid logic level being held during a hold period following said sampling clock transitioning.

In embodiments, in the event that the predicted memory access control value indicates that a read access is likely to occur, the step of causing the read access to be initiated from the memory occurs when the associated instruction is being executed in the execute pipelined stage.

Hence, the read access is initiated at the appropriate stage in the pipeline, but using the memory access prediction signal which is assured to not be metastable.

In embodiments, the step of generating the memory access prediction signal further includes the step of: generating a timing value indicative of when the associated instruction is likely to be executed in the execute pipelined stage and the step of generating the predicted memory access control value from the memory access prediction signal is responsive to the timing value such that the predicted memory access control value is provided for at least a period in which the associated instruction is likely to be executed in the execute pipelined stage.

In embodiments, the method further comprises the steps of: processing the instruction in the pipelined stages, the instruction causing an actual memory access signal to be generated; in the event the actual memory access signal has a value indicating a read access from the memory is to occur and the predicted memory access control value indicates that a read access is not likely to occur, causing the execution of the instruction to be stalled whilst an actual memory access control value is generated from the actual memory access signal, the actual memory access control value being generated to have a valid logic level thereby removing any metastability in the actual memory access signal value, and in the event that the actual memory access control value indicates that a read access is to occur, causing a read access to be initiated from the memory.

Hence, should the memory access prediction signal not predict that a memory access should occur then the instruction is stalled until the actual memory access control value is cleaned to remove any metastability in the same way as the memory access prediction signal was and in the event that the actual memory access control value indicates that a read access is to occur, a read access is initiated from the memory.

It will be appreciated that the resultant actual memory access control value may be used to update the lookup table.

According to a second aspect of the present invention there is provided an integrated circuit operable to access data in a pipelined data processing apparatus in which the operating conditions of the pipelined data processing apparatus are such that metastable values may occur on at least the boundaries of the pipelined stages, the integrated circuit comprising: a read access prediction circuit operable to receive an indication that an instruction is to be processed by the pipelined data processing apparatus, the read access prediction circuit being further operable to generate a memory access prediction signal, the memory access prediction signal having a value indicative of whether or not the instruction is likely to cause a read access from a memory; a prediction signal stabilizing circuit operable to generate a predicted memory access control value from the memory access prediction signal, the predicted memory access control value being generated to achieve and maintain a valid logic level for at least a sampling period thereby removing any metastability in the memory access prediction signal value; and a memory access circuit operable, in the event that the predicted memory access control value indicates that a read access is likely to occur, to cause a read access to be initiated from the memory.

According to a second aspect of the present invention there is provided an integrated circuit for accessing data in a pipelined data processing apparatus in which the operating conditions of the pipelined data processing apparatus are such that metastable values may occur on at least the boundaries of the pipelined stages, the integrated circuit comprising: read access prediction means for receiving an indication that an instruction is to be processed by the pipelined data processing apparatus and for generating a memory access prediction signal, the memory access prediction signal having a value indicative of whether or not the instruction is likely to cause a read access from a memory; prediction signal stabilizing means for generating a predicted memory access control value from the memory access prediction signal, the predicted memory access control value being generated to achieve and maintain a valid logic level for at least a sampling period thereby removing any metastability in the memory access prediction signal value; and memory access means for, in the event that the predicted memory access control value indicates that a read access is likely to occur, causing a read access to be initiated from the memory.

BRIEF DESCRIPTION OF THE DRAWINGS

Non-limiting example embodiments will now be described with reference to the accompanying drawings in which.

DESCRIPTION OF THE PREFERRED EMBODIMENTS

Figure 1:
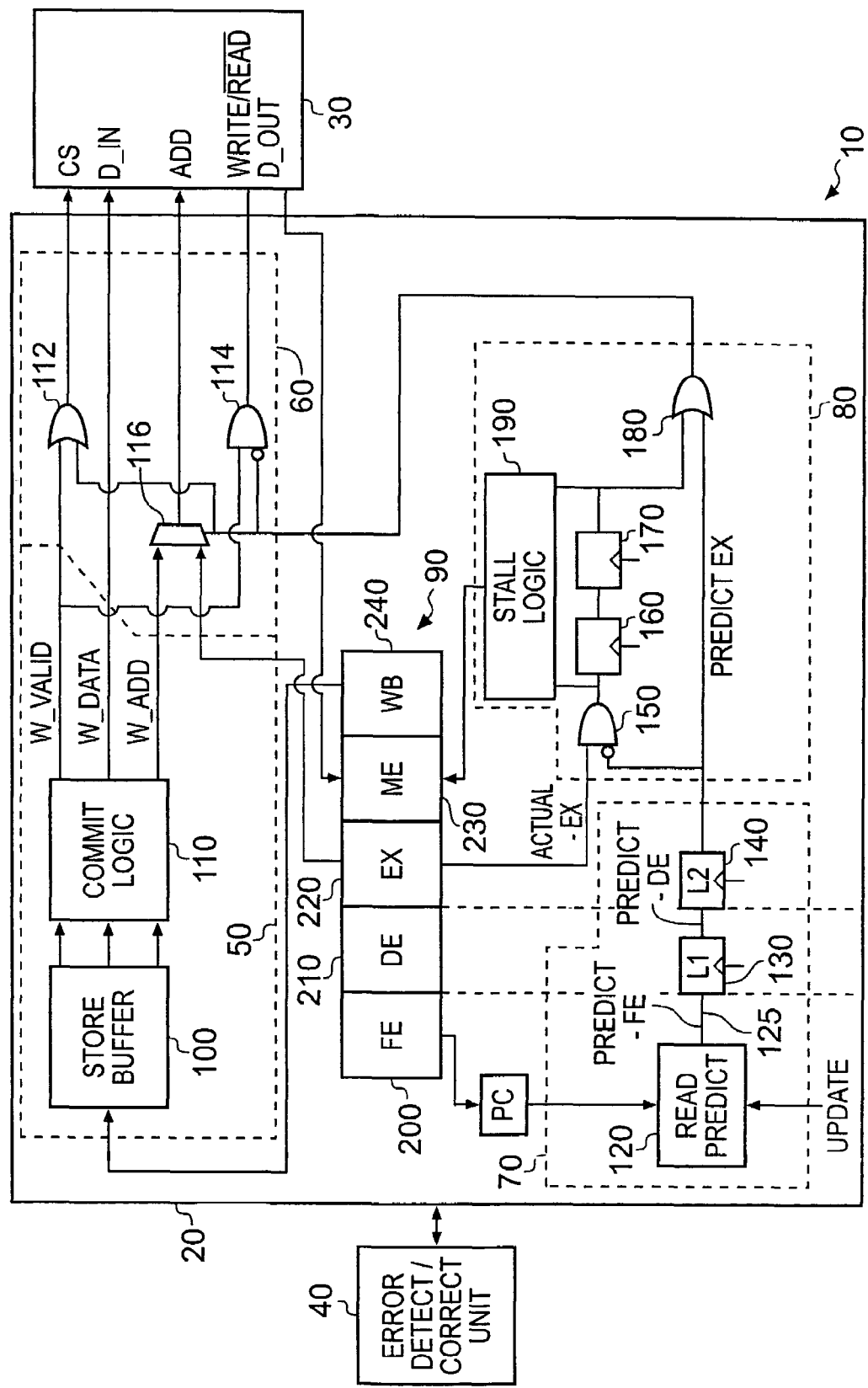
FIG. 1 illustrates a data processing apparatus according to an example embodiment.

FIG. 1 illustrates a data processing apparatus, generally 10, according to an example embodiment. The data processing apparatus 10 comprises a processor core 20 coupled with a data RAM 30 and an error detection/correction unit 40.

The processor core 20 is operable to process instructions and data retrieved from a main memory (not shown). The data RAM 30 is arranged to store data so that it is subsequently readily accessible by the processor core 20. The data RAM 30 will store the data values associated with the memory address until it is overwritten by a data value for a new memory address required by the processor core 20. The data values are stored in the data RAM 30 using either physical or virtual memory addresses. Well known cache allocation policies may be used when reading or writing data values to the data RAM 30.

Coupled with the processor core 20 is an error detection/correction unit 40. The error detection/correction unit 40 is operable to determine whether any errors occur during the processing of instructions. For example, the error detection/correction unit 40 will, at a system level, determine whether any timing violations have occurred in any of the signals used in the processing of data and, whether any metastability may have resulted.

In the event that it is determined that metastability might have occurred then the error detection/correction unit 40 will initiate the appropriate corrective measures in order to prevent incorrect operation of the data processing apparatus 10. For example, in the event that an error is detected, the operation of the data processing apparatus 10 may be reset or restarted from a safe position.

The processor core 20 comprises a pipeline 90 coupled with write logic 50, read access prediction logic 70, misprediction logic 80 and cache interface logic 60.

The write logic 50 comprises a store buffer 100 operable to store data values which have been indicated as being required to be allocated to the data RAM 30 and commit logic 110 which determines when data values stored in the store buffer 100 are available for storing in the data RAM 30.

The store buffer 100 comprises a first-in first-out buffer which receives data values from a write-back stage 240 of the pipeline 90. Data values to be placed in the store buffer 100 are qualified by stabilization stages (not shown) which are provided between the write-back stage 240 and the store buffer 100. The stabilization stages store the data values therein for a predetermined number of clock cycles. Once the predetermined number of clock cycles (in this example two clock cycles) has passed then the data value is stored in the store buffer 100 and will be available to the commit logic 110 for allocation to the data RAM 30. In this way, it can be ensured that any of the data values or signals used to write to the data RAM 30 have no metastability and, hence, no errors will occur in the data being written to the data RAM 30.

When the commit logic 110 receives data values from the store buffer 100 to be stored in the data RAM 30, the commit logic 110 provides a number of signals to the cache interface logic 60. These signals indicate whether data values are now available to be written to the data RAM 30 (W_VALID), the address associated with that data (W_ADD) and the data values themselves (W_DATA).

The W_VALID signal and the output from the OR gate 180 are provided to an OR gate 112. Should the W_VALID signal or the output from the OR gate 180 be set (indicating that either a write or a read access is to occur) then the Chip Select input of the data RAM 30 will be set. The W_VALID signal is provided to an AND gate 114 and the output from the OR gate 180 are provided to an inverting input of the AND gate 114. Should the W_VALID signal be set (indicating a write access is requested) and the output of the OR gate 180 is cleared (indicating that no read write access is requested) then the write/read input of the data RAM 30 will be set to indicate that a write access should occur; otherwise the write/read input of the data RAM 30 will be cleared to indicate that a read access should occur. The output of the OR gate 180 is provided to a multiplexer 116 to select either a write address provided by the commit logic 110 or a read address provided by the execute stage 220 depending on whether a write or a read access is to occur.

Coupled with the fetch stage 200 of the pipeline 90 is the read access prediction logic 70. The read access prediction logic 70 receives from the fetch stage 200 the value of the program counter associated with the instruction being fetched by the fetch stage 200.

The value of the program counter is provided to a read prediction circuit 120. The read prediction circuit 120 stores historic information indicating whether an instruction associated with that program counter value resulted in a read access to the data RAM 30.

In the event that the read prediction circuit 120 indicates that the program counter address is likely to be associated with a read access to the data RAM 30 then a prediction signal PREDICT_FE is asserted over the path 125 to an input of a first latch 130. Otherwise, no signal is asserted to the first latch 130.

On the rising edge of the next clock cycle, the PREDICT_FE signal is clocked through the first latch 130 and provided as a predict signal PREDICT_DE to the input of a second latch 140.

On the rising edge of the next clock cycle, the second latch 140 outputs a signal PREDICT_EX to the misprediction logic 80.

In this way, it will be appreciated that a simple prediction can be made as to whether the instruction being fetched will likely result in a read access to the data RAM 30 occurring. In the event that the read prediction circuit 120 indicates that a read access will occur then two cycles will have passed by the time this prediction signal has reached the execute stage 220, having been clocked through two latches. Accordingly, the prediction signal PREDICT_EX can be guaranteed to not be metastable.

As the prediction signal is being clocked through the latches, the instruction which was used to by the read prediction circuit 120 to generate the prediction signal also passes through the pipeline 90. By the time that the PREDICT_EX signal reaches the misprediction logic 80, the execute stage 220 will have generated an ACTUAL_EX signal which indicates whether the instruction appears to have resulted in a read access being required (it will be appreciated that the ACTUAL_EX signal may be metastable and so it is not certain a read access will be required).

Accordingly, the PREDICT_EX and the ACTUAL_EX signal may be compared.

In the event that the ACTUAL_EX signal provided by the execute stage 220 to the misprediction logic 80 and the PREDICT_EX signal indicates that a read access is to occur then the PREDICT_EX signal can be used to directly drive the cache interface logic 60 to cause a read of the data RAM 30. In this way, it will be appreciated that the signal used to cause a read from the data RAM 30 can be assured not to be metastable. This prevents many different types of errors from occurring when accessing data in the data RAM 30 and also helps to ensure that the data values in the data RAM 30 cannot become corrupted as a result of the read access.

In the event that the ACTUAL_EX signal indicates that a cache read should occur but the PREDICT_EX signal indicates that a cache read should not occur then the misprediction logic 80 is used to resolve this conflict.

The misprediction logic 80 comprises an AND gate 150, a first latch 160, a second latch 170, an OR gate 180 and stall logic 190.

The PREDICT_EX signal is received at an inverting input of the AND gate 150 with the other non-inverting input receiving the ACTUAL_EX signal.

Accordingly, in the event that the PREDICT_EX signal does not indicate that a read access will occur then the output of the OR gate 180 will be low, which will not cause a read access to be initiated in the data RAM 30.

However, in the event that the ACTUAL_EX signal indicates a read access should occur then the output of the AND gate 150 will be asserted which will cause the stall logic 190 to cause the memory and all earlier pipelined stages to stall.

On the next rising edge of the clock signal, the signal provided to the first latch 160 will be output to the second latch 170.

On the next rising edge of the clock signal the output of the second latch 170 will be provided to the stall logic and the OR gate 180.

By passing the output of the AND gate 150 through the synchronising structure consisting of the first latch 160 and the second latch 170, any metastability in that signal is resolved, enabling the output of latch 170 to be able to be used to initiate a data cache access in the event of a misprediction.

Also, the memory execute stage 230 will be stalled for two cycles. In this way, in the event that the ACTUAL_EX signal is resolved at the output of the latch 170 to cause a read access from the data RAM 30 then the OR gate 180 will assert an output which causes the cache interface logic 60 to access the data from the data RAM 30. Because this signal has also been delayed for two cycles it can be ensured that the signal driving the cache access is also not metastable.

In the event that the PREDICT_EX signal and the ACTUAL_EX signal differ, a resolved version of the ACTUAL_EX signal can be used in order to update the load prediction circuit 120 with details of whether a read access did or did not actually need to occur for that instruction having that program counter value. Alternatively, the ACTUAL_EX signal provided by the execute stage 220 may be provided via an alternative stabilization structure in order to update the load prediction circuit 120. Hence, the load prediction circuit 120 may be updated when either a read access occurred, but a read access was not predicted or a read access did not occur, but a read access was predicted.

Should it transpire that the PREDICT_EX signal used to cause a read access to occur was incorrect then the data value which was read may be simply discarded.

Figure 2:
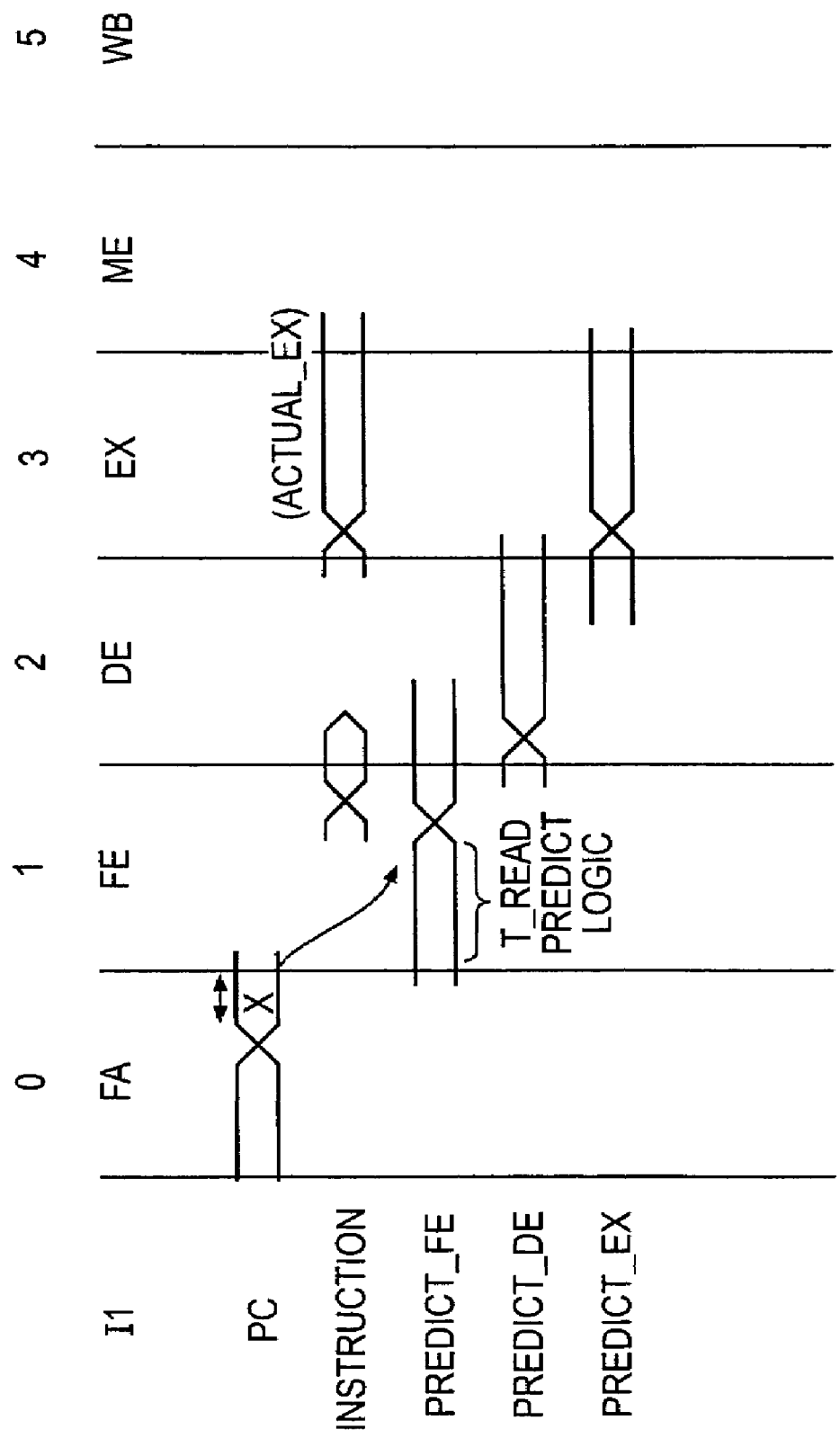
FIG. 2 is a timing diagram illustrating the operation of the read access prediction logic and the misprediction logic of FIG. 1.

FIG. 2 illustrates the operation of the read access prediction logic 70 and the misprediction logic 80 in more detail.

During clock cycle 0, the program counter is used to generate the instruction fetch address.

On the rising edge of clock cycle 1, the value of the program counter is latched into the fetch stage 200 and provided to the load prediction circuit 120. During clock cycle 1, the PREDICT_FE signal is determined, based on the value of the program counter.

On the rising edge of clock cycle 2, the output of the load prediction circuit 120 is sampled by the first latch 130 and provided as the PREDICT_DE signal.

On the rising edge of clock cycle 3, the PREDICT_DE signal is sampled by the second latch 140. During clock cycle 3, the output of the second latch 140 is provided as the PREDICT_EX signal to the misprediction logic 80. In the meantime, by clock cycle 3, the instruction has reached the execute stage 220 and the ACTUAL_EX signal is also presented to the misprediction logic 80. In the event that the PREDICT_EX signal indicates that a read access should occur, the read access will occur and if the ACTUAL_EX signal resolves to indicate that a read access should not occur then the read data will be discarded.

Figure 3:
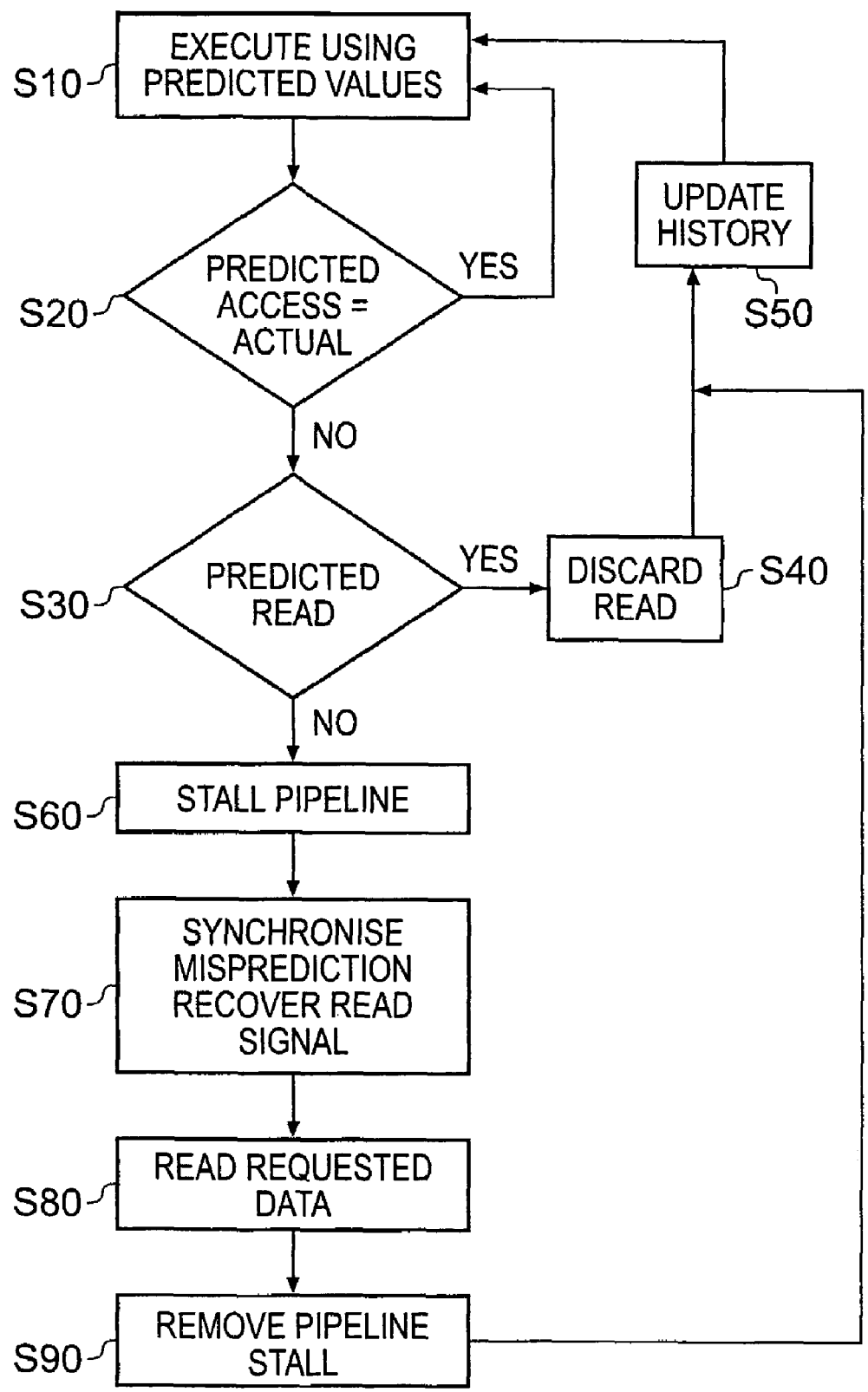
FIG. 3 is a flow chart illustrating the read access prediction technique in more detail performed by the data processing apparatus of FIG. 1.

FIG. 3 illustrates the read access prediction technique in more detail.

At step s10, the cache access is determined using the PREDICT_EX signal.

In the event that, at step s20, it is determined that the PREDICT_EX signal and the resolved ACTUAL_EX signal are identical then processing proceeds back to step s10.

In the event that it is determined that the PREDICT_EX signal and the resolved ACTUAL_EX signal are not identical then processing proceeds to step s30.

At step s30, it is determined whether a read was predicted by the PREDICT_EX signal but that the resolved ACTUAL_EX signal did not indicate that a read was required.

If it is determined that a read was not required then, at step s40, the read data value is discarded and at step s50 the history information associated with the read access prediction circuit 120 is updated to indicate that the instruction associated with that program counter value is not predicted to result in a read access.

If, at step s30, it is determined that the PREDICT_EX signal indicates that a read access was not predicted but that the ACTUAL_EX signal indicates that a read should occur then, at step s60, the pipeline will be stalled.

Thereafter, at step s70, the ACTUAL_EX signal will be resolved, and in the event that the ACTUAL_EX signal continues to indicate that a read access should occur then the history information associated with the load prediction circuit will be updated to indicate that a read access should occur for the instruction associated with that program counter value.

At step s80, the requested data value will be read from the data RAM 30.

Finally, at step s90, the stall on the pipeline 90 will be removed.

Through this approach, an indication that an instruction is to be processed by the pipelined data processing apparatus is received and a memory access prediction signal is then generated. The memory access prediction signal has a value indicative of whether or not the instruction is likely to cause a read access from a memory. The predicted memory access control signal is generated in a way which prevents any metastability being present in that signal. This is achieved by the predicted memory access control signal achieving and maintaining a valid logic level for at least a sampling period. A read access can then be initiated in the event that it is predicted that a read access is likely to occur. Hence, the signals used in a read access are prevented from being metastable which removes the possibility that metastable signals are used directly in the arbitration of data accesses. Also, the metastable signals may be prevented from being propagated from stage to stage.

Although a particular embodiment of the invention has been described herewith, it will be apparent that the invention is not limited thereto, and that many modifications and additions may be made in the scope of the invention. For example, various combinations of the features of the following dependent claims could be made with the features of the independent claims without departing from the scope of the present invention.

I claim:

1. A method of accessing data in a pipelined data processing apparatus in which the operating conditions of the pipelined data processing apparatus are such that metastable signals may occur on at least the boundaries of the pipelined stages, the method comprising the steps of:

receiving an indication that an instruction is being fetched for processing by the pipelined data processing apparatus;

generating a memory access prediction signal, the memory access prediction signal having a value indicative of whether or not the instruction being fetched for processing is likely to cause a read access from a memory;

generating for the fetched instruction a predicted memory access control value from the memory access prediction signal, the predicted memory access control value being generated to achieve and maintain a valid logic level for at least a sampling period thereby preventing any metastability in the predicted memory access control value; and controlling initiation of a read access from the memory in dependence upon the memory access control value;

wherein the step of generating the predicted memory access control value comprises the steps of:

passing the memory access prediction signal through a pair of latches, each latch being clocked to coincide with the passing of the instruction between subsequent boundaries of the pipelined stages.

2. The method of claim 1, wherein the step of generating the memory access prediction signal comprises the steps of:

determining a program counter value associated with the instruction being fetched for processing to be processed; and referencing a lookup table to provide the value indicative of whether or not the instruction associated with that program counter value is likely to cause a read access from the memory; and propagating the value provided by the lookup table as the memory access prediction signal.

3. The method of claim 2, further comprising the step of:

storing in the lookup table the value indicative of whether or not the instructions associated with program counter values are likely to cause read accesses from the memory.

4. The method of claim 1, wherein the step of generating the predicted memory access control value comprises the steps of:

passing the memory access prediction signal through a synchronizing structure to generate the predicted memory access control value having a valid logic level.

5. The method of claim 1, wherein the step of generating the predicted memory access control value comprises the steps of:

passing the memory access prediction signal to an input of a first one of the pair of latches;

providing an intermediate signal on the output of the first one of the pair of latches as the instruction passes between first and second pipelined stages;

passing the intermediate signal to an input of a second one of the pair of latches; and providing the predicted memory access control value on the output of the second one of the pair of latches as the instruction passes between second and third pipelined stages.

6. The method of claim 1, wherein the step of passing the memory access prediction signal through the pair of latches causes the predicted memory access control value to have timing characteristics which achieve a valid logic level prior to a setup period prior to a sampling clock transitioning, said valid logic level being held during a hold period following said sampling clock transitioning.

7. The method of claim 1, further comprising the steps of:

processing the instruction in the pipeline stages, the instruction causing an actual memory access signal to be generated;

in the event the actual memory access signal has a value indicating a read access from the memory is to occur and the predicted memory access control value indicates that a read access is not likely to occur, causing the execution of the instruction to be stalled whilst an actual memory access control value is generated from the actual memory access signal, the actual memory access control value being generated to have a valid logic level thereby removing any metastability in the actual memory access signal value, and in the event that the actual memory access control value indicates that a read access is to occur, causing a read access to be initiated from the memory.

8. An integrated circuit configured to access data in a pipelined data processing apparatus in which the operating conditions of the pipelined data processing apparatus are such that metastable values may occur on at least the boundaries of the pipelined stages, the integrated circuit comprising:

a read access prediction circuit configured to receive an indication that an instruction is being fetched for processing by the pipelined data processing apparatus, the read access prediction circuit being further configured to generate a memory access prediction signal, the memory access prediction signal having a value indicative of whether or not the instruction being fetched for processing is likely to cause a read access from a memory;

a prediction signal stabilizing circuit configured to generate for the fetched instruction a predicted memory access control value from the memory access prediction signal, the predicted memory access control value being generated to achieve and maintain a valid logic level for at least a sampling period thereby removing any metastability in the memory access prediction signal value; and a memory access circuit configured to control initiation of a read access from the memory in dependence upon the memory access control value;

wherein the prediction signal stabilizing circuit comprises:

a pair of latches configured to receive the memory access prediction signal, each latch configured to be clocked to coincide with the passing of the instruction between subsequent boundaries of the pipelined stages.

9. The integrated circuit of claim 8, wherein the read access prediction circuit is configured to determine a program counter value associated with the instruction to be processed, to reference a lookup table to provide the value indicative of whether or not the instruction associated with that program counter value is likely to cause a read access from the memory and to propagate the value provided by the lookup table in the read access prediction signal.

10. The integrated circuit of claim 9, wherein the read access prediction circuit is operable to determine the program counter value when processing the instruction during a fetch stage of the pipelined processor.

11. The integrated circuit claim 9, further comprising:

the lookup table configured to store the value indicative of whether or not the instructions associated with program counter values are likely to cause read accesses from the memory.

12. The integrated circuit of claim 8, wherein the prediction signal stabilizing circuit comprises:

a synchronizing structure configured to receive the memory access prediction signal and to generate the predicted memory access control value having a valid logic level.

13. The integrated circuit of claim 8, wherein the prediction signal stabilizing circuit comprises:

a first one of the pair of latches configured to receive the memory access prediction signal and to provide an intermediate signal on the output of the first one of the pair of latches as the instruction passes between first and second pipelined stages;

a second one of the pair of latches configured to receive the intermediate signal and to provide the predicted memory access control value on the output of the second one of the pair of latches as the instruction passes between second and third pipelined stages.

14. The integrated circuit of claim 12, wherein the prediction signal stabilizing circuit comprises:

a pair of latches configured to receive the memory access prediction signal and to generate the predicted memory access control value having timing characteristics which achieve a valid logic level prior to a setup period prior to a sampling clock transitioning, said valid logic level being held during a hold period following said sampling clock transitioning.

15. The integrated circuit of claim 8, further comprising:

pipelined stages configured to process the instruction, the instruction causing an actual memory access signal to be generated;

stall logic configured, in the event the actual memory access signal has a value indicating a read access from the memory is to occur and the predicted memory access control value indicates that a read access is not likely to occur, to cause the execution of the instruction to be stalled whilst an actual memory access control value is generated from the actual memory access signal, the actual memory access control value being generated to have a valid logic level thereby removing any metastabilty in the actual memory access signal value, and in the event that the actual memory access control value indicates that a read access is to occur, causing a read access to be initiated from the memory.

16. The integrated circuit of claim 8, further comprising a store buffer arranged to store a data value corresponding to a write access to said memory before said data value is written to said memory and wherein said data value is stored in a plurality of stabilization stages for a predetermined number of clock cycles before being stored in said store buffer.

17. An integrated circuit for accessing data in a pipelined data processing apparatus in which the operating conditions of the pipelined data processing apparatus are such that metastable values may occur on at least the boundaries of the pipelined stages, the integrated circuit comprising:

read access prediction means for receiving an indication that an instruction is being fetched for processing by the pipelined data processing apparatus and for generating a memory access prediction signal, the memory access prediction signal having a value indicative of whether or not the instruction being fetched is likely to cause a read access from a memory;

prediction signal stabilizing means for generating a predicted memory access control value from the memory access prediction signal, the predicted memory access control value being generated to achieve and maintain a valid logic level for at least a sampling period thereby removing any metastability in the memory access prediction signal value;

memory access means for controlling initiation of a read access from the memory in dependence upon the memory access control value;

the prediction stabilizing means comprising a pair of latches configured to receive the memory access prediction signal, each latch being clocked to coincide with the passing of the instruction between subsequent boundaries of the pipelined stages.

* * * * *